United States Patent [19]
Kepets

[11] 4,082,605
[45] Apr. 4, 1978

[54] PROCESSING PRINTED CIRCUIT BOARDS

[76] Inventor: Peter Kepets, Konigsberger Str. 2, D-6343 Frohnhausen, Germany

[21] Appl. No.: 628,532

[22] Filed: Nov. 3, 1975

[30] Foreign Application Priority Data

Nov. 19, 1974 Germany .............................. 2454709

[51] Int. Cl.² ............................................... C23F 1/02
[52] U.S. Cl. .................................... 156/656; 156/345; 156/666; 156/901; 427/98
[58] Field of Search ......................... 156/3, 6, 7, 8, 18, 156/345, 630, 633, 634, 654, 655, 656, 659, 901, 902, 666; 96/36, 36.2, 48 R, 48 HD; 427/96–98; 134/3, 41, 201; 401/192, 292

[56] References Cited

U.S. PATENT DOCUMENTS

| 3,182,671 | 5/1965 | Voric | 156/345 X |
| 3,201,238 | 8/1965 | Dwyer | 96/36 |
| 3,954,940 | 5/1976 | Rice et al. | 156/16 X |

*Primary Examiner*—William A. Powell
*Attorney, Agent, or Firm*—Christie, Parker & Hale

[57] ABSTRACT

A method and apparatus for etching, developing, or plating circuit boards with a solution utilizing a transparent container in which the circuit board is contacted with the solution.

21 Claims, 5 Drawing Figures

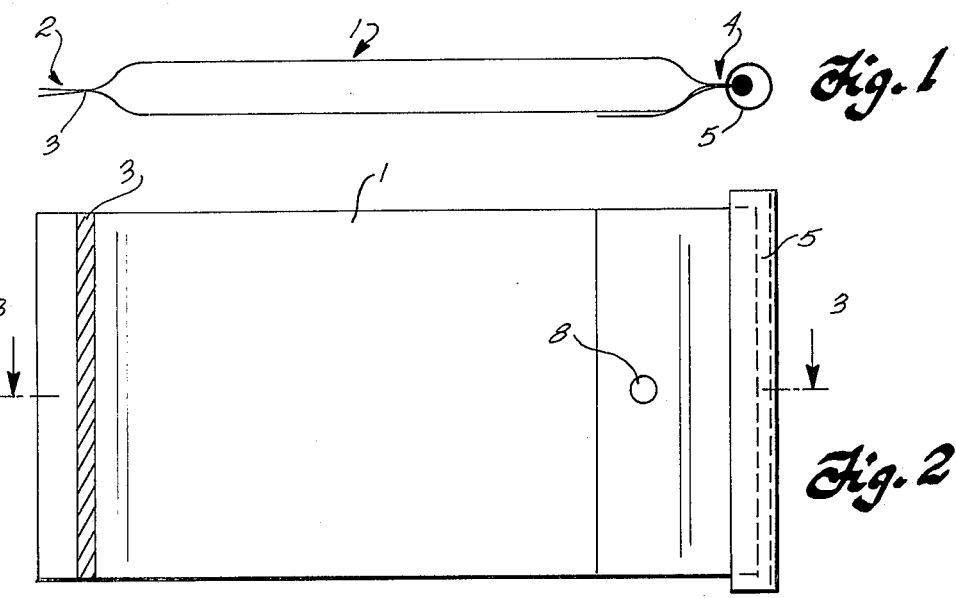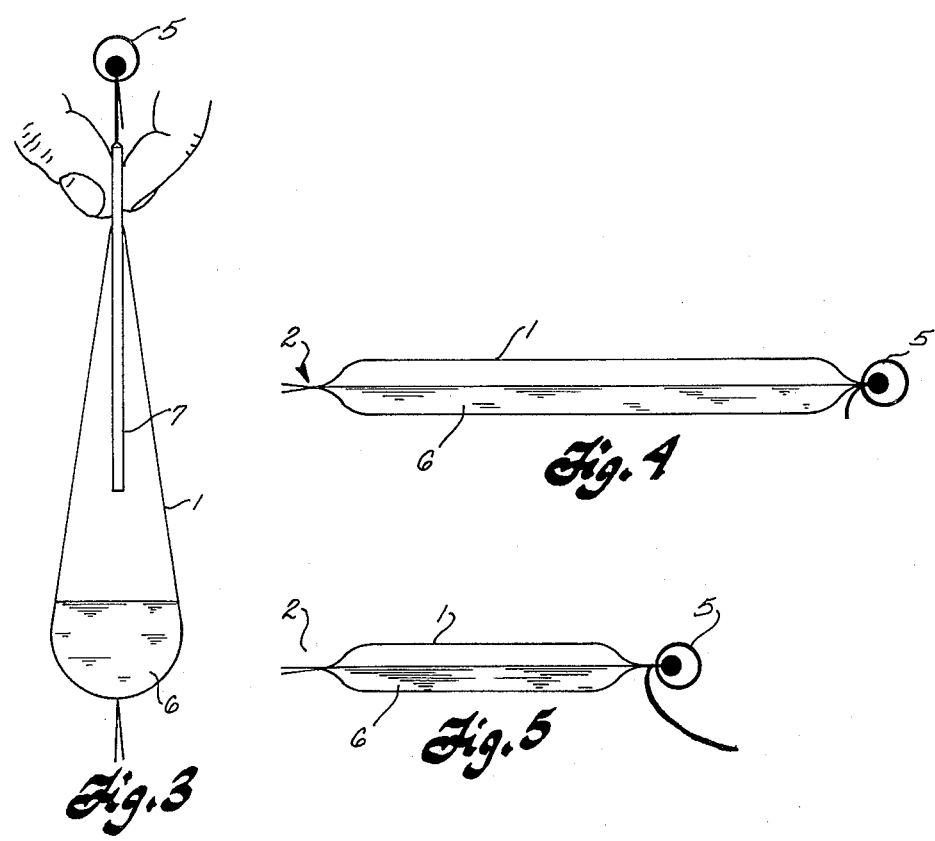

PROCESSING PRINTED CIRCUIT BOARDS

CROSS REFERENCE

A claim of priority is made per the provisions of 35 U.S.C. 119 based on German patent application No. P2454709.9 filed on Nov. 19, 1974.

BACKGROUND OF THE INVENTION

This invention is for a process and an apparatus for manufacturing and for the subsequent handling of printed circuits, and particularly for manufacturing small numbers of single printed-circuits.

At present, the etching of prepared printed-circuit boards takes place in etching machines, in trays, in sinks, and in vessels. Particularly for laboratory use, where a printed circuit infrequently is made, it is uneconomical to use an etching machine. Not only is the investment relatively high for an etching machine, but the etchant must be kept at a constant temperature in order to avoid crystallization of the etchant solution. Thus, for laboratories where only a few printed circuits are produced, the use of an etching machine does not make much sense.

A problem with etching printed-circuits in trays lies in the fact that such trays are used only for the etching process itself. The etchant has to be prepared elsewhere and heated, and then poured into the tray. Thus, a certain amount of spillage or staining is usually unavoidable. In addition, considerable evaporation takes place because of the relatively large surface area; the disadvantage of this is that these fumes are highly corrosive. In addition to the fumes, another problem with trays lies in the need to keep the etchant at a certain temperature, which is difficult to do with open trays. Care must also be taken to avoid gas blisters on the circuit board, which result from the waste deposits of the etchant. After the etching process is concluded, the etchant must be removed from the tray to a container since the tray is unsuited for storing the etchant for a long period of time. Thus, there is again danger of spillage or staining. A further disadvantage of etching printed circuits in trays is that a relatively large and uneconomical amount of etchant is required in relation to the size of the printed circuit board itself. Thus, the relationship of the etchant volume to the size of the board is much too high.

Generally, the same problems that occur when etching in trays arise when etching printed circuits in sinks. Although the surface area in sinks is usually smaller in relation to the etchant volume than in trays, and it is sometimes possible to seal a sink with a tight cover, thus using the sink as a storage area, nevertheless escaping fumes cannot be avoided. and it is difficult to heat the etchant in the sink from the outside. The heating is sometimes accomplished by means of a specially installed heating system in the sink or by means of immersion-heaters. In both cases, however, special safety precautions must be followed. Since the size of the sink is determined by the size of the largest printed circuit to be etched, the relationship of the etchant volume to the size of the printed circuit board is very great. This requires a relatively long heating period. Since sinks of this kind are usually high and narrow, the printed circuits must be fastened by means of special clamps before they can be immersed into the etchant. As in the case of the other known etching apparatuses, a further drawback of this kind of sink is that the process of the etching process cannot be observed without removing the board from the etchant. Thus, it is not possible to influence the etching process in individual cases by shortening the process on areas that are already fully etched or ever-etched, or lengthening the process on areas not sufficiently etched.

In summary, the aforementioned known methods and apparatuses which are now available to meet the needs of development laboratories, research institutes, schools and hobbyists are too costly, complicated, unhygienic and unwieldy. This is also true when treating circuit boards by developing a photo-resist coating, and when further handling a printed circuit by gold-plating, silver-plating or zinc-plating.

Therefore, there is a need for a process and an apparatus with which printed circuits can be developed, etched, tin-plated, silver-plated and gold-plated in a simple, economical and hygienic manner.

SUMMARY OF THE INVENTION

I have now invented a method and apparatus having the above features. My invention relates to a process for developing, etching and/or further handling, as by plating, printed circuits comprising the steps of: filling a tightly closed, water-resistant, transparent container or pouch, the walls of which preferably consist of a flexible plastic, with a required amount of treating solution; inserting a circuit board into the solution; closing the container and heating the solution if necessary; and contacting the circuit board with the treating solution. Preferably, the contacting is carried out with the treating solution under constant movement, with continuous observation of the process.

It is preferred that the container be made in the form of a tube or bag, the available volume of which can be adjusted by clamping off the unneeded part of the bag to conform to the size and shape of the board being treated. It is advantageous that this tube or pouch be closed at one end as by heat-sealing and temporarily closable at the other end as by a removable clamp.

The advantage of this invention is that the container can be used for preparing the treating solution, as well as for developing, etching, tin-plating, silver-plating or gold-plating the printed circuit. The stirring and mixing of the solution can be accomplished simply by kneading the container prior to inserting the circuit board. While mixing the solution, the container is closed tight by means of a clamp, thus preventing the liquid from escaping. Following this, the printed circuit board is inserted into the solution and the container is again tightly closed by means of the clamp. The heating or cooling of the solution to a required temperature can be accomplished by placing the container in a water bath, in running water, or in an air stream. No particular precautions are needed here since the container is tightly closed, thus preventing the water from penetrating the container or permitting the treating solution from leaking out. The thinness of the walls or the container assure rapid heating or cooling of the solution, as is required, e.g., under running water.

After treatment of the circuit board is completed, the container needs only be held upright so that the solution collects at the bottom of the container. The liquid which is still on the surface of the board can drip off, so that the printed circuit can be removed from the container practically dry. A special advantage of the invention lies in the hygienic nature of the process. At no time does the operator come into contact with chemicals, nor is there danger of spillage or spotting.

The present invention also relates to a container for carrying out the process, the walls of which consist of a flexible transparent plastic which can be closed hermetically. Preferably the container consists of a tube or bag, one end of which is heat-sealed tight, while the open end can be closed by means of a clamping apparatus.

This invention also contemplates a kit for treating circuit boards by etching, plating or developing, with a treating solution containing a solute and solvent. The kit contains a transparent container for holding the treating solution in contact with the circuit board wherein the size and shape of the container is adjustable to conform to the size and shape of the circuit board, and means for adjusting the size and shape of the container. The kit also contains the treating solution. The solution may be placed in the lower part of the container and closed tight by the adjusting means which can be a clamp. Alternatively, just the solute, such as crystalline ferric chloride, can be placed in the lower part of the container, and the user of the kit can add the necessary solvent such as water. In addition the container can have a hook or eyelet so that it can be suspended and stored for use at a later time.

DRAWINGS

These and other features and advantages of the present invention will be appreciated as the same become better understood by reference to the following detailed description and appended claims when considered in connection with the accompanying drawings wherein:

FIG. 1 shows a side view of a container embodying features of this invention;

FIG. 2 shows a top-view of the container of FIG. 1;

FIG. 3 shows the container of FIG. 2 along line 3—3 with a printed circuit in the container; and FIG. 4 is a cross-sectional view of the container of FIG. 3, the volume of which is completely utilized; and FIG. 5 is a cross-sectional view of the container of FIG. 3, the volume of which is partially utilized.

DETAILED DESCRIPTION OF THE INVENTION

This invention is for a process and an apparatus for manufacturing and for the subsequent handling of printed circuits, and particularly for manufacturing small numbers of single printed-circuits. This invention relates to a process for developing, etching and/or further handling as by plating, printed circuits comprising the steps of: filling a tightly closed, water-resistant, transparent container or pouch, the walls of which preferably consist of a flexible plastic, with a required amount of treating solution; inserting a circuit board into the solution; closing the container and heating the solution if necessary; and contacting the circuit board with the treating solution.

As shown in FIGS. 1 and 2, it is preferred that a container or pouch consist of a tube, the lower end 2 of which is sealed by means of a permanent double-seal 3 formed by heat sealing. Thus if one seal is damaged, the container still remains tightly closed. The upper end 4 of the tube is folded over and then closed tight with a clamp 5. The container 1 is made of a transparent and preferably plastic material which is compatible with the treating solution to be used. For example, the container may be formed of polyethylene or polypropylene when etching a copper coated circuit board with a ferric chloride solution. As used herein, the term "transparent" also means translucent. What is required is that the treating solution be visible through the walls of the container.

The plastic container 1 can be used equally for processing various sizes of printed circuit boards. The volume of the container can be reduced easily by clamping off, as shown in FIG. 5 for example, by means of a clamp 5, a smaller or larger section from the top of the container 1. In this way, the minimum required quantity of etchant can be used for a given printed circuit board.

Preferably, a kit containing the container 1 will be provided with a crystalline chemical or solute used in making the treating solution already in the container. In shipping the container 1, the removeable clamp 5 temporarily closes the container directly above the chemical contained in the lower part. The clamp must be such that neither air nor moisture can enter the closed section of the container. The crystalline chemical can be brought to solution 6 by means of heat and/or the addition of water. After the solution is formed, the clamp is removed and the printed circuit board to be processed is inserted into the container. After this, the container is again closed by means of the clamp 5 just above the printed circuit board. In order to bring the treating solution 6 to the desired temperature, all that is required is to hold the plastic container under running warm or cold water, by placing it in a water-bath of the desired temperature, or in an air stream of the desired temperature. When etching circuit boards with a ferric chloride solution, the etching solution is maintained at a temperature less than about 40° C, and preferably at a temperature from about 25° C to about 30° C for optimum control of the etching process.

The actual processing of the printed circuit board 7 preferably takes place under constant movement of the container 1. In this way the etching, developing or plating speed can be controlled. Also, more or less heat can be applied to one part of the printed circuit board to ensure all areas of the board are adequately treated, but not over-treated.

After the treating procedure is ended, the container is held upright with the clamp 5 at the top end of the container. The board 7 in the interior of the container 1 is then positioned in the upper part of the container so that the solution 6 can drain off. The drops remaining on the board can be brushed off by stroking the container against the board, Thus, when the container 1 is opened, the printed circuit board is removed practically dry. If another board is not processed immediately, then the container 1 is closed again by means of the clamp 5 directly above the solution 6, thus insuring that no air or moisture can enter.

As shown in FIG. 2, there may be a hole or eyelet 8 at the top of the container 1 so that it can be hung up and stored for later use.

In addition to the process and the container described above, this invention contemplates a kit for treating circuit boards by etching, plating or developing with a treating solution containing a solute and solvent. The kit comprises a transparent container as described above and mans for adjusting the size and shape of the container. The kit may also include an untreated circuit board, and when the kit is for use in etching circuit boards, means for protecting the part of the board which is not to be etched and means for cleaning the circuit board after etching. In addition, a single kit can contain sufficient components for developing, etching, and plating circuit boards. Also, a kit for etching can contain a powder for neutralizing and solidifying the etching solution so that it may be easily discarded.

It has been found that when a kit embodying features of this inventions is used for treating a circuit board by etching it is possible to etch from about 4 to about 6 circuit boards with one charge of ferric chloride etching solution. It was found that the first board took about 5 minutes to be completely etched, and that the third board was etched in only about 10 minutes. It also has been found that a ferric chloride etching solution can be left in the bag for 6 months and still maintain its efficacy. When etching is done in trays rather than by the method of this invention, the etching solution loses its efficacy after being allowed to set for more than a day or two.

Another advantage of the method of this invention is that close control of the process parameters is not required because the bag is transparent or translucent, and thus it is possible to observe the effect of the treating solution on a circuit board. Thus when etching a circuit board satisfactory results may be obtained over a wide range of temperatures, concentration of solute in the etching solution, time of etching, and ratio of etching solution to circuit board surface area as long as the operator closely observes the treating process.

This inventon permits the production of single printed circuits or small series of printed circuits much more economically then hitherto known methods since a very small volume of solution is required. This is possible, first, because the container is closed off by means of a clamp immediately behind the printed circuit board being used, while the depth of the solution is kept to a few millimeters more than the thickness of the printed circuit board itself. Second, it is not necessary for the printed circuit board to be immersed in the solution at all times. Guiding the solution over the printed circuit board at intervals utilizing a wave effect is sufficient for adequate etching, or for further handling, and assures a uniformly processed surface. In addition to speeding up the etching, developing or plating process by the movement of the container, the invention provides a further advantage in that it permits the operator to check the developing, etching or plating process at all times. Thus, it is possible to influence the chemical reaction, e.g., of developing, etching, gold-plating, siliver-plating or tin-plating by pressing the flexible container against a particular part of the printed circuit board, thus permitting this part to obtain more warmth or cooling, as the case may be. It is also possible to warm the surface of the printed circuit board by rubbing the container. This continuous control of the process permits the interruption of the chemical reaction at the most advantageous moment and to avoid under-etch during the etching process, or, in the case of plating, an unclean or spotty surface.

A major advantage of this process is that the entire procedure of developing, etching, tin-plating, silver-plating or gold-plating takes place in a closed container. Thus, corrosive fumes cannot escape from the container.

Another advantage of this process is that it is possible to treat two sides of a circuit board at one tim while observing the progress of the treatment so that the optimum amount of treatment can be effected. Also, it is possible to store the treating solution in the container after using it, and in the case of ferric chloride etchant solution, it is possible to reuse the solution. Furthermore, when a flexible container is used, the container can expand to accommodate any fumes given off by the treating process.

The present invention has been described with reference to preferred embodiments of the method and apparatus. However, because of variations of the preferred embodiments which are obvious to those skilled in the art, such as a container having a closable drain for the treating solution, the spirit and scope of the appended claims should not be necessarily limited to the description of the preferred embodiments.

What is claimed is:

1. In a process for treating a circuit board with a liquid treating solution, the improvement which comprises the steps of:
    (a) placing a liquid treating solution for a circuit board into a transparent, flexible container having an opening;
    (b) inserting the circuit board into the container through the opening;
    (c) sealing the container by temporarily closing the opening of the container; and
    (d) contacting the circuit board with the liquid treating solution while the opening is temporarily closed.

2. A process as claimed in claim 1 comprising the additional step of locally heating at least one selected section of the circuit board.

3. A process as claimed in claim 1 comprising the additional step of locally cooling at least one selected section of the circuit board.

4. A process as claimed in claim 1 comprising the additional steps of:
    (a) tilting the container to drain the treating solution away from the opening; and
    (b) opening the temporarily closed opening of the container.

5. A process as claimed in claim 1 comprising the additional step of suspending the container.

6. A process as claimed in claim 1 wherein the treating solution contains solvent and solute and the step of placing treating solution into the container comprises placing the solute into the container and then placing the solvent into the container.

7. A process as claimed in claim 1 comprising the additional step of moving the container to move the treating solution in the container to control the treating process.

8. The process of claim 1 including the step of adjusting the volume of the container to conform to the shape of the circuit board to be treated.

9. The process of claim 1 wherein the step of sealing the container comprises hemetically sealing the container.

10. A process as claimed in claim 1 comprising the additional step of maintaining the treating solution at an effective temperature for treating.

11. A process as claimed in claim 10 wherein the step of maintaining the treating solution at an effective temperature for treating the circuit board comprises a method selected from the group consisting of dipping the container into a water-bath, placing the container in running water, placing the container in an air stream, and combinations thereof.

12. The process of claim 10 wherein the step of maintaining the treating solution at an effective termperature comprises placing the container in an air stream.

13. The process of claim 10 wherein the step of maintaining the treating solution at an effective temperature comprises placing the container in running water.

14. A process as claimed in claim 1 wherein the container is in the form of a tube and the volume of the tube is adjustable to conform to the shape of the circuit board to be treated and including the step of adjusting the volume of the tube to conform to the shape of the circuit board to be treated.

15. A process as claimed in claim 14 wherein the tube is permanently sealed at one end and the step of temporarily closing comprises placing a removable clamp at the opposite end of the tube.

16. In a process for etching circuit boards with an aqueous etching solution containing ferric chloride, wherein the circuit board has at least one copper surface layer, the improvement which comprises the steps of:
   (a) placing a circuit board etching solution into a transparent, flexible tube permanently sealed at one end and open at the opposite end;
   (b) inserting the circuit board into the tube through the open end;
   (c) hermetically sealing the tube by temporarily closing the open end of the tube;
   (d) heating the etching solution to a temperature of less than about 40° C while the open end is closed;
   (e) contacting the circuit board with heated etching solution while the open end is closed;
   (f) continuously moving the heated etching solution while the open end is closed;
   (g) opening the temporarily closed end of the tube when the circuit board is etched to a desired level;
   (h) tilting the tube to drain the etching solution away from the opened end; and
   (i) removing the etched circuit board from the tube through the opened end.

17. The process of claim 16 wherein the etching solution is heated to a temperature of from about 25 to about 35° C.

18. In a process for treating a circuit board by etching, developing, plating with a treating solution, or the like, the improvement which comprises the steps of:
   (a) placing a circuit board treating solution into a transparent, flexible, container having an opening and made of a material compatible with the treating solution;
   (b) inserting the circuit board into the container through the opening;
   (c) temporarily closing the opening of the container by means of a clamp;
   (d) contacting the circuit board with the treating solution while the opening is temporarily closed; and (e) removing the circuit board from the container.

19. The process of claim 18 wherein the step of temporarily closing comprises closing the opening of the container so the container is hermetically sealed.

20. In a process for treating a circuit board with a liquid treating solution, the improvement which comprises the steps of:
   (a) placing a liquid treating solution for a circuit board into a transparent, flexible, container sealed at one end and having an opening;
   (b) inserting the circuit board into the container through the opening;
   (c) temporarily closing the opening of the container to hermetically seal the container;
   (d) contacting the circuit board with the liquid treating solution while the container is hermetically sealed;
   (e) opening the temporarily closed opening of the container when the circuit board is treated to a desired level; and
   (f) removing the treated circuit board from the container through the opened opening.

21. A method of processing a printed circuit board with a treating solution, for example by developing a printed circuit, by etching a printed circuit, or by plating a printed circuit with gold, silver or tin, comprising the steps of:
   (a) disposing printed circuit together with a required amount of a liquid treating solution in a transparent, flexible container, and thereafter closing the container in a leak-proof manner by means of a removable clamp, and thereafter
   (b) heating the container, constantly moving the container, and observing the progress of the processing through the container.

* * * * *